US012791944B2

(12) United States Patent
Melchior

(10) Patent No.: US 12,791,944 B2
(45) Date of Patent: Nov. 10, 2026

(54) OPTICAL COMPONENT FOR DEEP ULTRAVIOLET LIGHT SOURCE

(71) Applicant: Cymer, LLC, San Diego, CA (US)

(72) Inventor: John Theodore Melchior, San Diego, CA (US)

(73) Assignee: Cymer, LLC, San Diego, CA (US)

( * ) Notice: Subject to any disclaimer, the term of this patent is extended or adjusted under 35 U.S.C. 154(b) by 636 days.

(21) Appl. No.: 18/246,748

(22) PCT Filed: Oct. 12, 2021

(86) PCT No.: PCT/US2021/054610
§ 371 (c)(1),
(2) Date: Mar. 27, 2023

(87) PCT Pub. No.: WO2022/093527
PCT Pub. Date: May 5, 2022

(65) Prior Publication Data
US 2023/0375934 A1 Nov. 23, 2023

Related U.S. Application Data

(60) Provisional application No. 63/163,348, filed on Mar. 19, 2021, provisional application No. 63/107,827, filed on Oct. 30, 2020.

(51) Int. Cl.
*G03F 7/20* (2006.01)
*G03F 1/82* (2012.01)
*G03F 7/00* (2006.01)

(52) U.S. Cl.
CPC .............. *G03F 7/2004* (2013.01); *G03F 1/82* (2013.01); *G03F 7/70008* (2013.01)

(58) Field of Classification Search
CPC ...... G03F 7/2004; G03F 1/82; G03F 7/70008; G02B 5/0891; G02B 5/283; G02B 27/0006; G02B 5/0833; G02B 5/0883
(Continued)

(56) References Cited

U.S. PATENT DOCUMENTS 6,841,402 B1 1/2005 Hirayanagi
8,153,241 B2 4/2012 Schreiber et al.
(Continued)

FOREIGN PATENT DOCUMENTS

CN 101911250 A 12/2010
CN 106405688 A 2/2017
(Continued)

OTHER PUBLICATIONS

A.D. Bakun, et al., "Method of formation of super-smooth optical surfaces using GCIB and ANAB processes," Applied Surface Science, vol. 523, article No. 146384, https://doi.org/10.1016/j.apsusc.2020.146384 (Apr. 25, 2020) 7 total pages.
(Continued)

*Primary Examiner* — Michael Maskell
(74) *Attorney, Agent, or Firm* — DiBerardino McGovern IP Group LLC

(57) ABSTRACT

An optical component includes: a calcium fluoride substrate including an atomically-smooth substrate surface that forms at least a portion of an optically-interacting surface; and a sealant layer covering the atomically-smooth substrate surface to thereby form a smooth interface between the calcium fluoride substrate and the sealant layer. A profile roughness parameter Ra of the atomically-smooth substrate surface defined as a mean deviation of a profile of the atomically-smooth substrate surface is within a range of 0.01 nanometers (nm) to and including 0.17 nm.

20 Claims, 8 Drawing Sheets

(58) Field of Classification Search
USPC ........................................................ 250/504 R
See application file for complete search history.

(56) References Cited

U.S. PATENT DOCUMENTS

| | | | |
|---|---|---|---|
| 8,169,705 B2 | 5/2012 | Cangemi et al. | |
| 8,629,393 B1 | 1/2014 | Kirkpatrick et al. | |
| 8,672,138 B2 | 3/2014 | Raizen et al. | |
| 8,847,148 B2 | 9/2014 | Kirkpatrick et al. | |
| 9,117,628 B2 | 8/2015 | Kirkpatrick et al. | |
| 9,254,544 B2 | 2/2016 | Feng et al. | |
| 2002/0019136 A1 | 2/2002 | Suzuki | |
| 2005/0025882 A1 | 2/2005 | Partlo et al. | |
| 2006/0046099 A1 | 3/2006 | Maier et al. | |
| 2006/0192147 A1 | 8/2006 | Kandaka et al. | |
| 2008/0050910 A1 | 2/2008 | Hart et al. | |
| 2009/0141358 A1* | 6/2009 | Cangemi | G02B 5/285 359/586 |
| 2010/0055453 A1* | 3/2010 | Feng | G02B 1/02 428/338 |
| 2010/0215932 A1* | 8/2010 | Schreiber | G02B 5/0833 428/428 |
| 2014/0268083 A1 | 9/2014 | Barman et al. | |
| 2015/0070673 A1* | 3/2015 | Lalovic | G03F 7/70358 355/67 |
| 2017/0044315 A1 | 2/2017 | Mitsuhashi et al. | |
| 2018/0323568 A1* | 11/2018 | Furusato | H01S 3/137 |

FOREIGN PATENT DOCUMENTS

| | | |
|---|---|---|
| DE | 102009038908 A1 | 3/2010 |
| JP | 2002082211 A | 3/2002 |
| JP | 2010089251 A | 4/2010 |
| JP | 2010196168 A | 9/2010 |
| JP | 2011505592 A | 2/2011 |
| JP | 2014102507 A | 6/2014 |
| KR | 20070017476 A | 2/2007 |
| TW | 200602665 A | 1/2006 |
| TW | 201443549 A | 11/2014 |
| TW | 201544509 A | 12/2015 |
| TW | I687756 B | 3/2020 |
| WO | 198802790 A1 | 4/1988 |
| WO | 2009064875 A1 | 5/2009 |
| WO | 2016086204 A | 6/2016 |
| WO | 2020176205 A1 | 9/2020 |

OTHER PUBLICATIONS

European International Searching Authority, International Search Report and Written Opinion, counterpart PCT Application No. PCT/US2021/054610, mailed Apr. 19, 2022, 19 total pages.

S. Kirkpatrick, et al., "Accelerated Neutral Atom Beam (ANAB) Technology for Nanoscale Surface Processing," TechConnect Briefs 2019 pp. 93-96, Accessible at https://briefs.techconnect.org/wp-content/volumes/TCB2019/pdf/753.pdf.

S. Kirkpatrick, et al., "Improved laser damage threshold performance of calcium fluoride optical surfaces via Accelerated Neutral Atom Beam (ANAB) processing," Society of Photo-Optical Instrumentation Engineers (SPIE) Conference Series, vol. 9632, Nov. 23, 2015, 8 total pages.

Mariastefania De Vido et al. "Impact of gas cluster ion and accelerated neutral atom beam surface treatments on the laser-induced damage threshold of ceramic Yb:YAG." Optical Materials Express, vol. 7, No. 9 (Sep. 1, 2017) 4 total pages.

E. Barth et al. Accelerated Neutral Atom Beam (ANAB) Processing for Atomic Layer Etch (ALE), Neutral Physics Corporation, Atomic Layer Deposition Conference, Jul. 25, 2016, Accessible at: www.neutralphysics.com/wp-content/uploads/2016/08/2016-07-21AcceleratedNeutralAtomBeamProcessingforALE.pdf, 16 total pages.

Sean Kirkpatrick, "EUV Pellicle Development via Accelerated Neutral Atom Beam (ANAB) Processing of Ultra-thin Membranes," International Symposium on Extreme Ultraviolet Lithography, Oct. 4, 2015, Accessible at: http://www. heutralphysics.com/wp-content/uploads/2016/01/Accelerated-Neutral-Atom-Beam-Processing-of-Ultra-thin- Membranes-to-for-EUV-Pellicle-Development-09.28.15A.pdf 9 total pages.

Daniel R. Steinke et al., "Demonstrating Manufacturability of Atomic Level Etch (ALE) through Accelerated Neutral Atom Beam (ANAB) Processing," Colleges of Nanoscale Science and Engineering, Suny Polytechnic Institute, Jul. 2017, Accessible at: http://www.neutralphysics.com/wp-content/uploads/2017/07/Atomic-Layer-Etch-Workshop-Denver-July15-18-2017-SaP11-DRSteinke.pdf 1 page.

Taiwan Intellectual Property Office, Office Action, counterpart TW Application No. 112118859, mailed Jul. 24, 2023, 23 total pages (including English translation of 9 pages).

* cited by examiner

OPTICAL COMPONENT FOR DEEP ULTRAVIOLET LIGHT SOURCE

CROSS REFERENCE TO RELATED APPLICATIONS

This application claims priority to U.S. Application No. 63/107,827, filed Oct. 30, 2020, titled OPTICAL COMPONENT FOR DEEP ULTRAVIOLET LIGHT SOURCE; and U.S. Application No. 63/163,348, filed Mar. 19, 2021, titled OPTICAL COMPONENT FOR DEEP ULTRAVIOLET LIGHT SOURCE, each of which are incorporated herein in their entireties by reference.

TECHNICAL FIELD

The disclosed subject matter relates to an optical component that is used in a deep ultraviolet light source, such optical component being more optically robust.

BACKGROUND

One kind of gas discharge light source used in photolithography is termed an excimer light source or laser. Typically, an excimer laser uses a combination of one or more noble gases, which can include argon, krypton, or xenon, and a reactive gas, which can include fluorine or chlorine. The excimer laser can create an excimer, a pseudo-molecule, under appropriate conditions of electrical simulation (energy supplied) and high pressure (of the gas mixture), the excimer only existing in an energized state. The excimer in an energized state gives rise to amplified light in the ultraviolet range. An excimer light source can use a single gas discharge chamber or a plurality of gas discharge chambers. When the excimer light source is performing, the excimer light source produces a deep ultraviolet (DUV) light beam. DUV light can include wavelengths from, for example, about 100 nanometers (nm) to about 400 nm.

SUMMARY

In some general aspects, an optical component includes: a calcium fluoride substrate including an atomically-smooth substrate surface that forms at least a portion of an optically-interacting surface; and a sealant layer covering the atomically-smooth substrate surface to thereby form a smooth interface between the calcium fluoride substrate and the sealant layer. A profile roughness parameter Ra of the atomically-smooth substrate surface defined as a mean deviation of a profile of the atomically-smooth substrate surface is within a range of 0.01 nanometers (nm) to and including 0.17 nm.

Implementations can include one or more of the following features. For example, another profile roughness parameter Rz of the atomically-smooth substrate surface defined as an average of a peak-to-valley height of a profile within a selected sampling length of the atomically-smooth substrate surface can be within a range of 1.0 nm to 1.6 nm.

The optical component can be configured for a light beam that has a wavelength of 193 nm. The optical component can be a window of a gas discharge chamber, a beam reverser, a beam expansion prism, an output coupler, or a beam splitter. The optical component can be configured for a light beam that has a wavelength in the deep ultraviolet range.

The sealant layer can be configured to prevent the depletion of fluorine from the calcium fluoride substrate.

The atomically-smooth substrate surface can be actually formed using accelerated neutral atom beam processing. The formation of the atomically-smooth substrate surface can exclude (that is, not include) mechanical processing, ionized plasma processing, or chemical etching. The atomically-smooth substrate surface can lack defects, scratches, contaminant particles, and subsurface damage.

In other general aspects, an optical system for deep ultraviolet (DUV) optical lithography includes a gas discharge system that includes one or more gas discharge chambers, each gas discharge chamber housing an energy source and containing a gas mixture that includes a gain medium; and one or more optical components associated with the gas discharge system. Each optical component includes: a substrate including an atomically-smooth substrate surface that forms at least a portion of an optically-interacting surface; and a protective layer configured to mitigate or prevent damage of the atomically-smooth substrate surface caused at least in part by irradiation of DUV light, the protective layer deposited onto the atomically-smooth substrate surface to thereby form a smooth interface between the substrate and the protective layer.

Implementations can include one or more of the following features. For example, the gas discharge system can include two discharge chambers including a master oscillator configured to produce a pulsed seed light beam and a power amplifier configured to produce a pulsed output light beam from the seed light beam. At least one of the optical components can be configured to feed the pulsed seed light beam from the master oscillator to the power amplifier.

The optical component can be a window of one of the gas discharge chambers, a beam reverser, a beam expansion prism, an output coupler, or a beam splitter.

A profile roughness Ra of the atomically-smooth substrate surface defined as a mean deviation of a profile of the atomically-smooth substrate surface can be within a range of 0.01 nanometers (nm) to and including 0.17 nm.

The atomically-smooth substrate surface can be actually formed using accelerated neutral atom beam processing. The atomically-smooth substrate surface can lack defects, scratches, contaminant particles, and subsurface damage.

In other general aspects, a method is performed for mitigating or preventing damage of an optical surface of an optical component in a deep ultraviolet (DUV) light source. The method includes: providing a substrate comprising a substrate surface that forms at least a portion of the optical surface of the optical component; smoothing the substrate surface by impacting the substrate surface with at least one accelerated neutral atom beam; and after smoothing the substrate surface, depositing a protective layer onto the substrate surface such that an interface is formed between the substrate and the protective layer, the protective layer configured to mitigate or prevent damage of the optical surface.

Implementations can include one or more of the following features. For example, the substrate surface can be smoothed by removing high regions at the substrate surface and leaving low regions at the substrate surface. The substrate surface can be smoothed by reducing a profile roughness Ra of the surface to a value below and including 0.17 nanometers (nm).

The substrate surface can be impacted by adjusting a material removal rate that is dependent on an atomic cluster density and a processing time. The substrate surface being impacted with the at least one accelerated neutral atom beam can include: impacting the substrate surface at each step in a sequence of steps with a distinct one of the accelerated neutral atom beams. Moreover, the material removal rate can be adjusted at each step of impaction. The material removal rate can be within a range of 0.3 nanometers per step to 30 nanometers per step.

The substrate can be made of calcium fluoride.

The substrate surface can be smoothed by impacting the substrate surface with the at least one accelerated neutral atom beam until a profile roughness Ra of the substrate surface defined as a mean deviation of a profile of the substrate surface is within a range of 0.01 nm to and including 0.17 nm.

The optical component can be configured for a light beam that has a wavelength of 193 nm. The optical component can be a window of a gas discharge chamber, a beam reverser, a beam expansion prism, an output coupler, or a beam splitter.

The substrate surface can be smoothed by removing a redeposition layer at the substrate surface of the substrate, the redeposition layer formed during mechanical polishing of the substrate surface prior to smoothing the substrate surface. The substrate surface can be smoothed by removing subsurface damage, scratches, defects, and contaminant particles from the substrate surface. The substrate surface can be smoothed by removing damage and defects from the substrate surface without adding additional damage or defects to the substrate surface.

In other general aspects, an optical component includes: a calcium fluoride substrate having a smooth substrate surface that forms at least a portion of an optically-interacting surface; and a sealant layer deposited onto the smooth substrate surface. The smooth substrate surface is actually formed using accelerated neutral atom beam processing.

Implementations can include one or more of the following features. For example, a profile roughness Ra of the smooth substrate surface defined as a mean deviation of a profile of the smooth substrate surface can be within a range of 0.01 nanometers (nm) to and including 0.17 nm.

The sealant layer can be configured to prevent the depletion of fluorine from the calcium fluoride substrate.

The optical component can be configured for a light beam that has a wavelength in the deep ultraviolet range. The optical component can be configured for a light beam that has a wavelength of 193 nm. The optical component can be a window of a gas discharge chamber, a beam reverser, a beam expansion prism, an output coupler, or a beam splitter.

The formation of the smooth substrate surface can exclude (that is, does not include) mechanical processing, ionized plasma processing, or chemical etching.

In other general aspects, an optical component is actually formed using a process comprising: providing a substrate including a substrate surface that forms at least a portion of the optical surface of the optical component; smoothing the substrate surface by impacting the substrate surface with at least one accelerated neutral atom beam; and, after smoothing the substrate surface, depositing a protective layer onto the substrate surface such that an interface is formed between the substrate and the protective layer, the protective layer configured to mitigate or prevent damage of the optical surface.

DESCRIPTION

Figure 1:
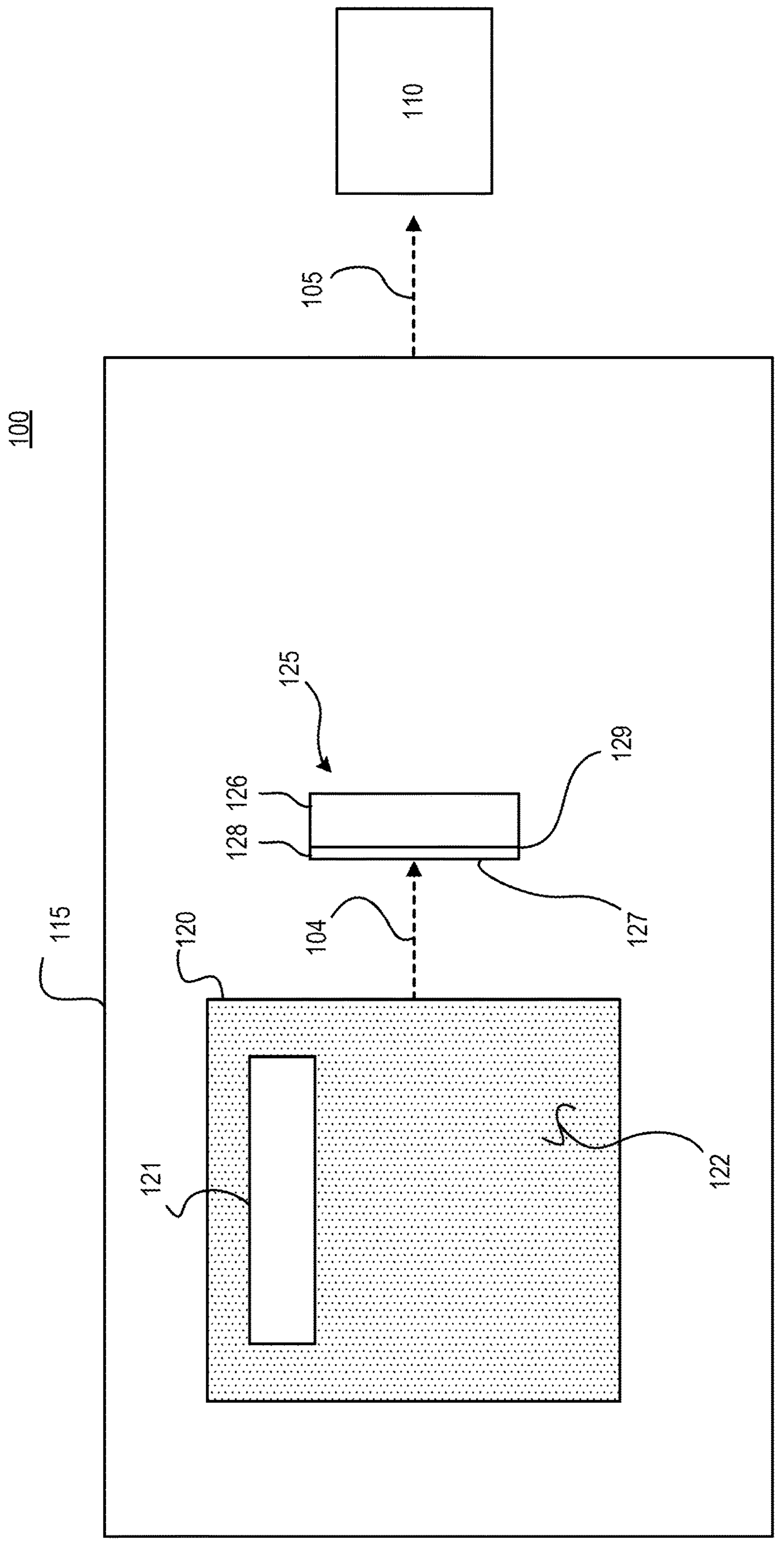
FIG. 1 is a block diagram of an optical system that produces a light beam, the optical system including a gas discharge system including one or more gas discharge chambers and one or more optical components.

Referring to FIG. 1, an optical system 100 produces a light beam 105 (which can be an amplified light beam) that has a wavelength in the deep ultraviolet (DUV) spectrum for use in DUV lithography by a lithography exposure apparatus 110. The wavelength of the light beam 105 is therefore in a range of about 100 nanometers (nm) to about 400 nm. The optical system 100 includes a gas discharge system 115 that includes one or more gas discharge chambers 120, and one or more optical components 125. Any of the optical components 125 can be associated with any one of the gas discharge chambers 120 or can be associated with other optical elements within the gas discharge system 115. While one gas discharge chamber 120 and optical component 125 are shown in FIG. 1, there could be more than one gas discharge chamber 120 and more than one optical component 125. Each gas discharge chamber 120 includes an energy source 121 and contains a gas mixture 122 that includes a gain medium. For example, if the gain medium includes argon fluoride (ArF), then the wavelength of the light beam 105 is about 193 nm. The light beam 105 can be a pulsed light beam.

Each of the optical components 125 is configured to interact with a pre-cursor light beam 104 that eventually forms the light beam 105 that is output from the gas discharge system 115. Thus, the optical component 125 can be arranged at any appropriate location within the gas discharge system 115. Depending on the location of the optical component 125, the pre-cursor light beam 104 that interacts with the optical component 125 can have the same energy and/or power of the light beam 105, or, it can have a different energy and/or power from the light beam 105. In various situations, the pre-cursor light beam 104 may be a light beam circulating within a laser cavity. In any case, the pre-cursor light beam 104 can be a pulsed light beam that can cause damage to the optical component 125 over time. Accordingly, the optical component 125 is made of a material that is able to withstand the high levels of fluence applied to the optical component 125 when being irradiated by the pre-cursor light beam 104. For example, the light beam 105 is a pulsed light beam that can have pulse energies greater than, for example, 20 milliJoules (mJs) per pulse. The optical component 125 can be subject to fluences as large as 80 $mJ/cm^2$ per pulse. For example, in some implementations, the optical component 125 includes a substrate that is made of calcium fluoride ($CaF_2$).

Over time, the optical component 125 becomes damaged with irradiation of the pre-cursor light beam 104, and the damage to the optical component 125 degrades performance of the gas discharge system 115 and therefore the optical system 100 and reduces the lifetime of the gas discharge chamber 120. For example, if the substrate 126 of the optical component 125 is made of $CaF_2$, and at certain wavelengths of the pre-cursor light beam 104, then an optically-interacting region 127 of the optical component 125 can suffer damage due to fluorine escape and crystal collapse that is induced by the pre-cursor light beam 104 impinging on the surface of the substrate of the optical component 125. In order to reduce such damage, the substrate 126 of the optical component 125 is coated with a sealant layer or protective layer 128, but even this protective layer 128 eventually breaks down and leads to localized surface damage on the optical component 125.

To improve the lifetime of the optical component 125 (and the gas discharge chamber 120), the interface 129 between the protective layer 128 and the $CaF_2$ substrate 126 should be as defect-free and clean as possible. To this end, the optical component 125 is manufactured using accelerated neutral atom beam processing.

Figure 2A:
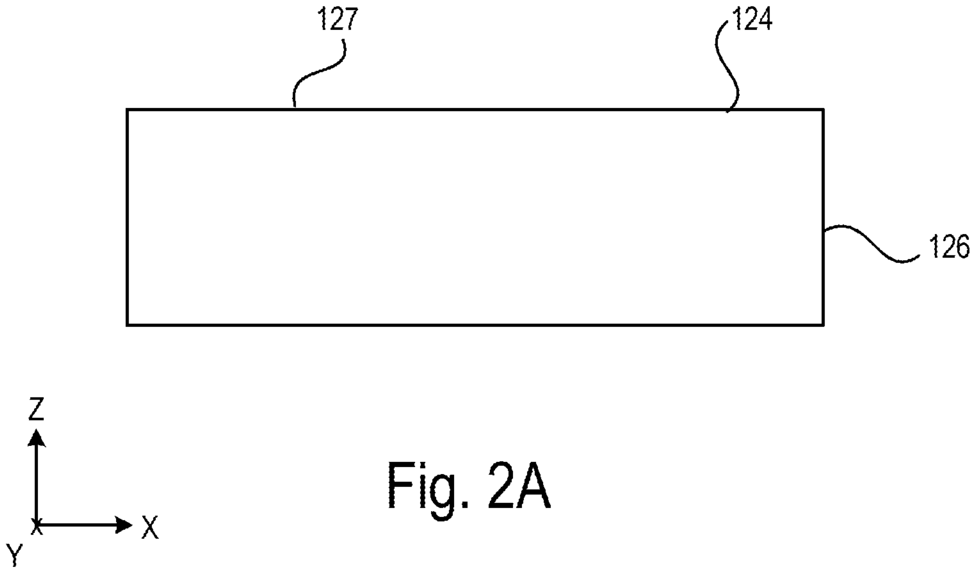
FIG. 2A is a side cross-sectional view of a substrate of the optical component of FIG. 1 after it has been processed using accelerated neutral atom beam processing.
Figure 2B:
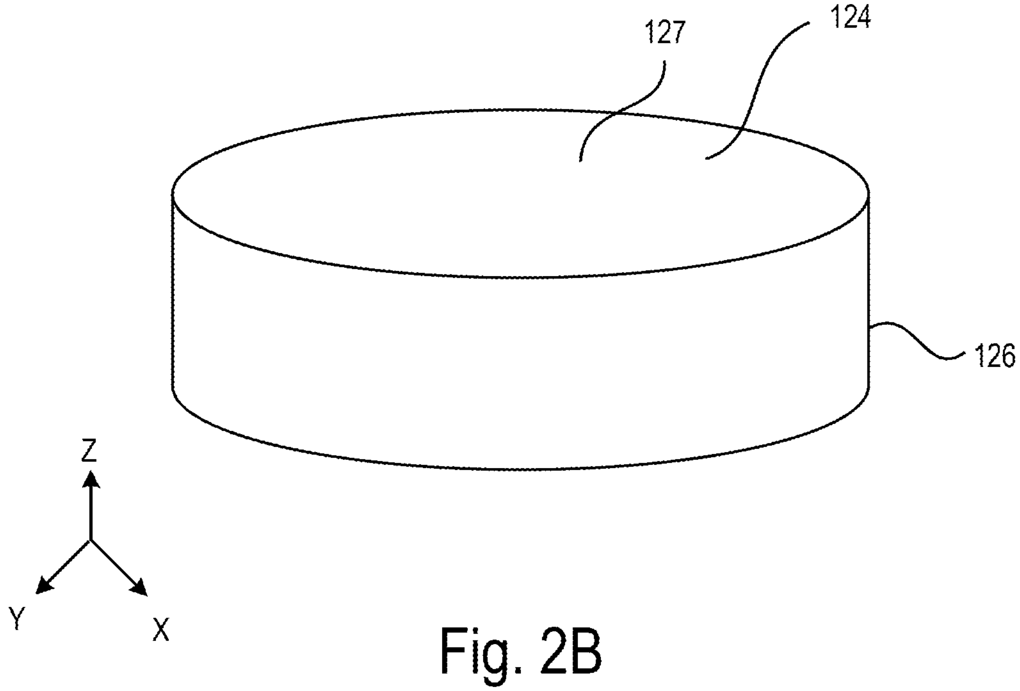
FIG. 2B is a perspective view of the substrate of FIG. 2A.
Figure 5B:
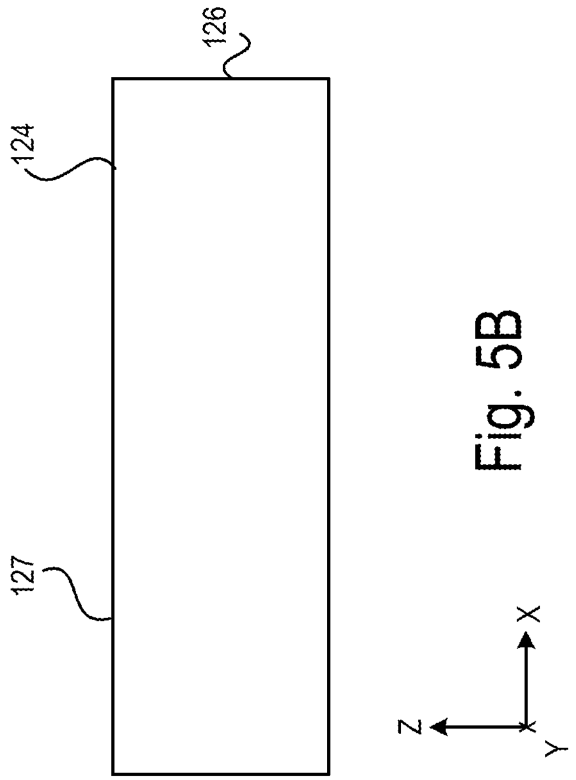
FIG. 5B is a schematic illustration of the cross-sectional view of the substrate of FIG. 5A after accelerated neutral atom beam processing.
Figure 5A:
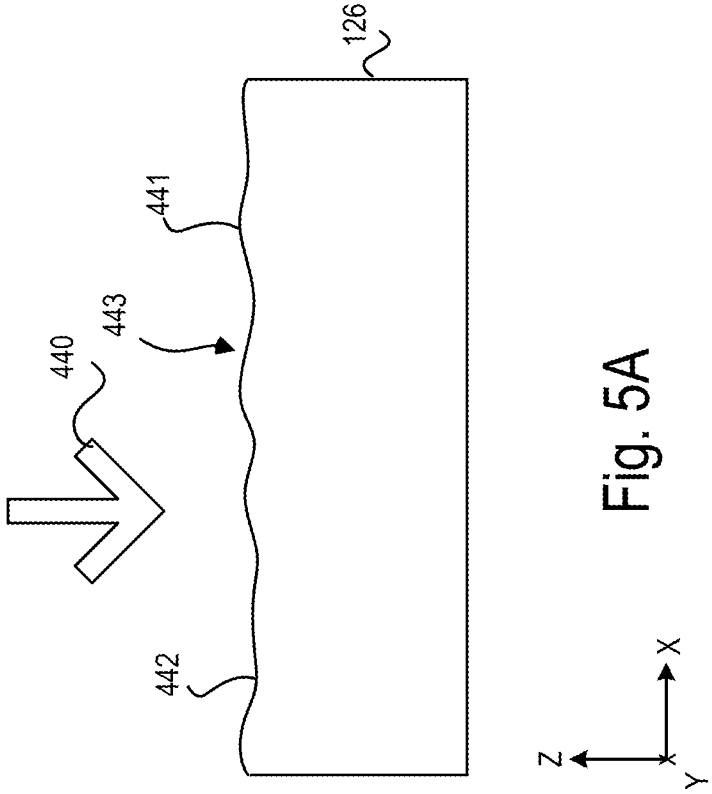
FIG. 5A is a schematic illustration of a cross-sectional view of a substrate showing accelerated neutral atom beam processing within the procedure of FIG. 4.

Specifically, as shown in FIGS. 2A and 2B, prior to being coated with the protective layer 128, an atomically-smooth substrate surface 124 of the substrate 126 is actually formed or has been actually formed using accelerated neutral atom beam processing. At the atomically-smooth substrate surface 124, a pristine crystal lattice of the substrate material, that is, the crystal lattice as it was originally grown, is exposed. In other words, the surface 124 of the $CaF_2$ substrate 126 that will eventually form the interface 129 between the protective layer 128 and the $CaF_2$ substrate 126 is impacted or hit with at least one accelerated neutral atom beam (as shown in FIG. 5A) such that a thin layer of $CaF_2$ (which is the substrate material) as well as defects and contaminants are evenly and cleanly removed from the surface 124 without adding additional damage to the surface or the subsurface of the substrate 126. In this way, the surface 124 of the substrate 126 is formed into the atomically-smooth substrate surface 124 that lacks these defects and contaminants that cause damage to the optical component 125 and the optical system 100.

The atomically-smooth substrate surface 124 forms at least a portion of the optically-interacting region 127 of the optical component 125. In particular, optically-interacting region 127 is that region of the substrate 126 with which the light beam 104 interacts. The optically-interacting region 127 therefore includes all of the surfaces, materials, and interfaces that interact with the light beam 104. Since the optical component 125 is a transmissive optic, the light beam 104 interacts with the protective layer 128, the interface 129, the substrate surface 124, and even the substrate 126.

The atomically-smooth substrate surface 124 has a profile roughness parameter Ra, defined as a mean deviation of a profile of the atomically-smooth substrate surface 124, that is within a range of 0.01 nanometers (nm) to and including 0.17 nm. In some implementations, the atomically-smooth substrate surface 124 also has another profile roughness parameter Rz, defined as an average of a peak-to-valley height of a profile within a selected sampling length of the atomically-smooth substrate surface 124, that is within a range of 1.0 nm to 1.6 nm. Thus, the atomically-smooth substrate surface 124 lacks defects, damage, scratches, and contaminants that cause damage to the optical component 125 and degradation of the optical system 100 over time. Because the atomically-smooth substrate surface 124 is actually formed using accelerated neutral atom beam processing (instead of alternatively using chemical etching, mechanical processing, or ionized plasma processing), additional damage is not added to the surface of the substrate 126 when the atomically-smooth substrate surface 124 is processed or formed. To say it another way, the final smoothing step in the formation of the atomically-smooth substrate surface 124 does not include mechanical processing, ionized plasma processing, or chemical etching. Thus, the atomically-smooth substrate surface 124 lacks or has very few defects, scratches, contaminant particles, and subsurface damage.

Figure 3A:
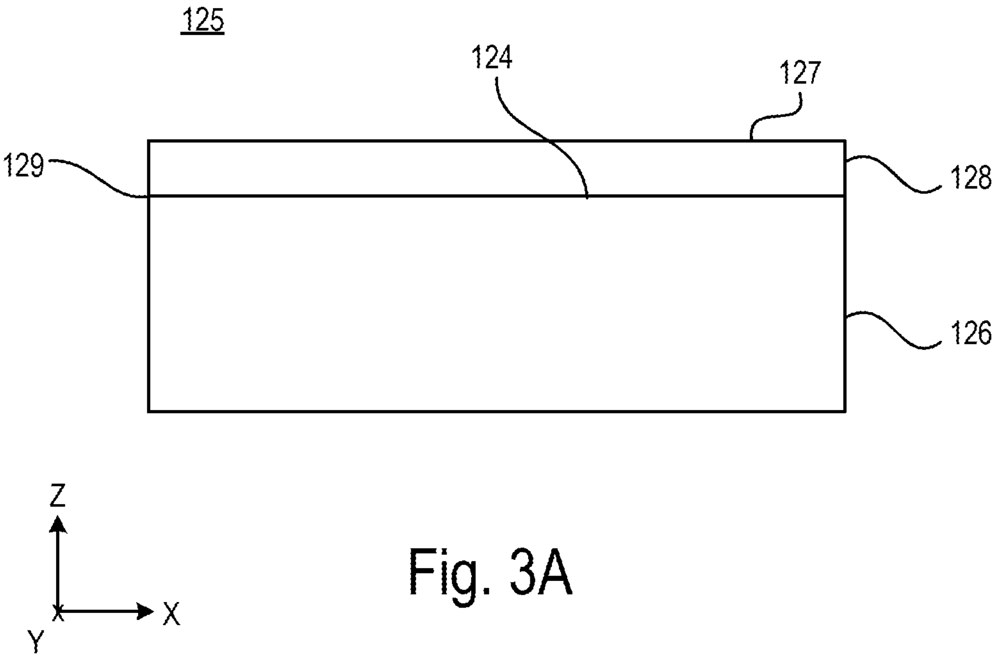
FIG. 3A is a side cross-sectional view of the optical component of FIG. 1 after it has been processed using accelerated neutral atom beam processing to form an atomically-smooth substrate surface and a protective layer is applied to the atomically-smooth substrate surface.
Figure 3B:
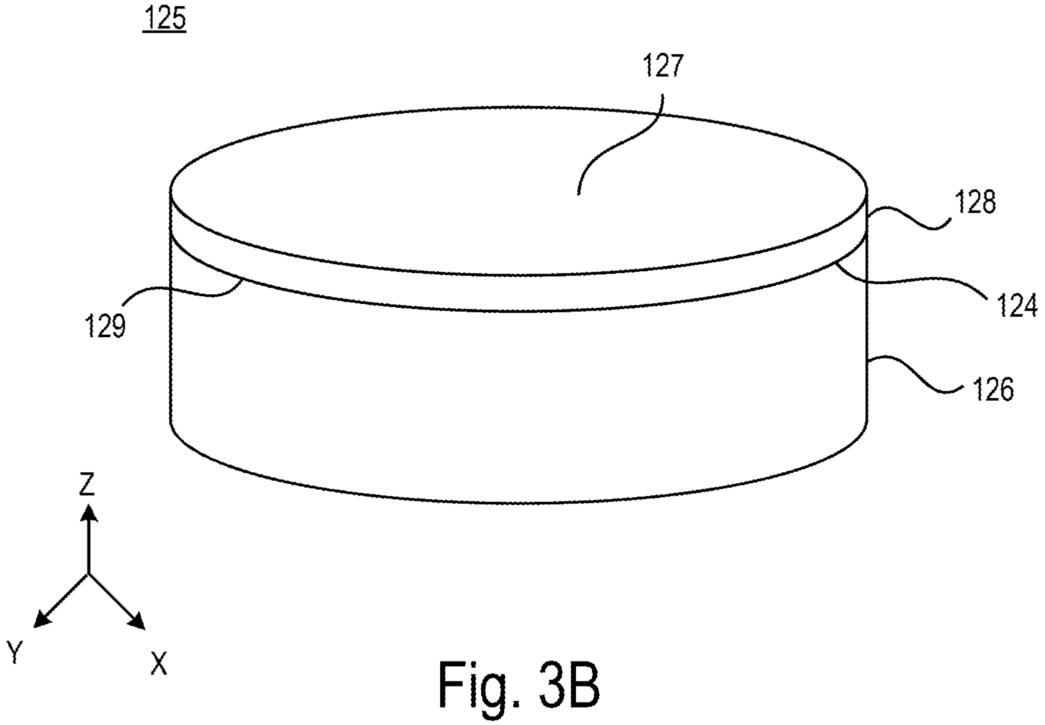
FIG. 3B is a perspective view of the optical component of FIG. 3A.

In addition, as shown in FIGS. 3A and 3B, when the protective layer 128 covers (or is deposited onto) the atomically-smooth substrate surface 124, the interface 129 is formed as a smooth (or atomically-smooth) interface 129 between the surface 124 of the $CaF_2$ substrate 126 and the protective layer 128, such interface 129 lacking defects and contaminants, thereby improving the lifetime of the optical component 125 and the optical system 100.

Figure 4:
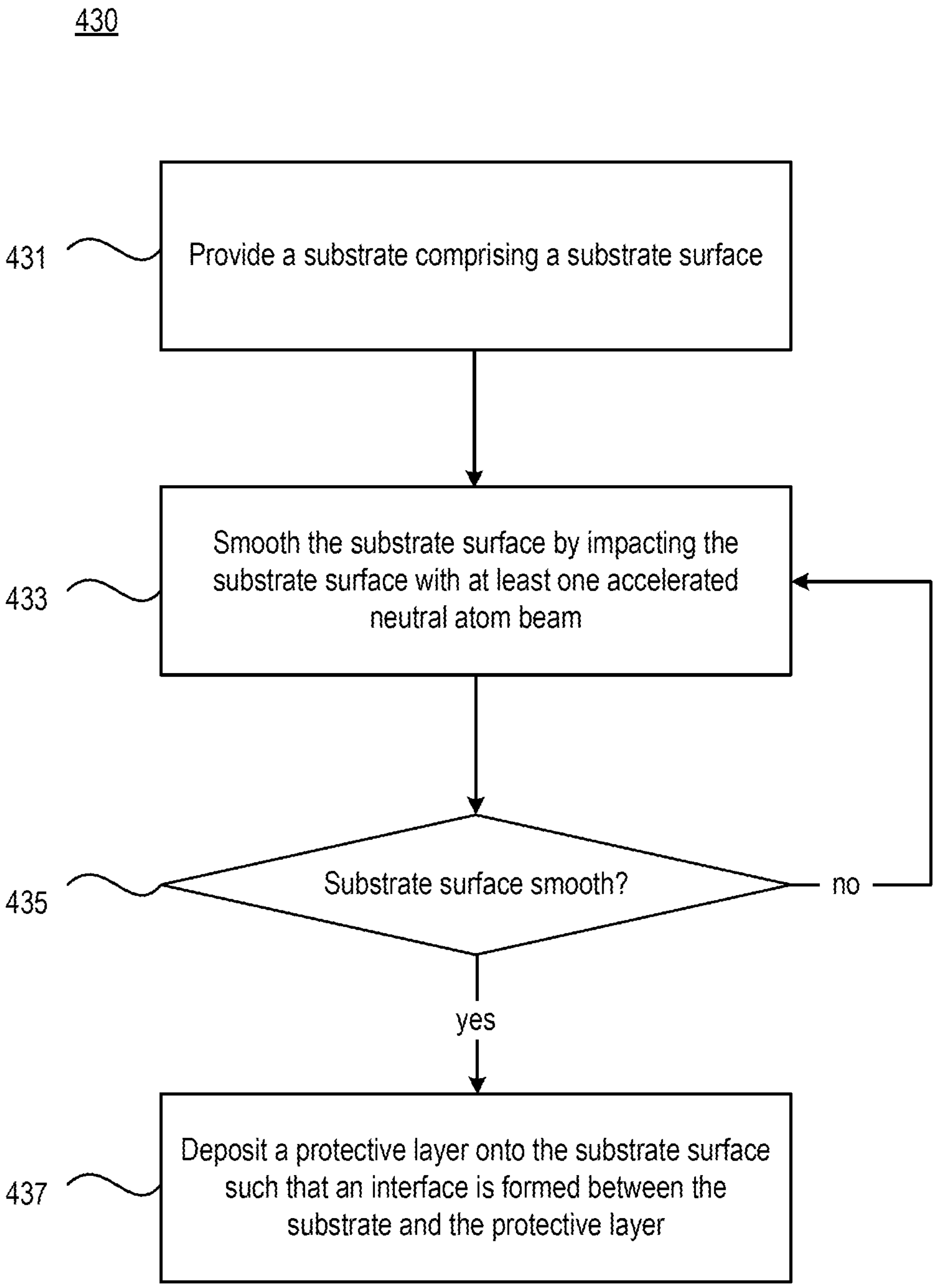
FIG. 4 is a flow chart of a procedure for forming the optical component of FIGS. 1, 3A, and 3B.

Referring to FIG. 4, a procedure 430 is performed for mitigating or preventing damage of the surface 124 (within the optical region 127) of the optical component 125 in the optical system 100 (or DUV source). The procedure 430 is performed with respect to the surface 124 of the optical component 125 (FIGS. 1-3B) in the optical system 100.

The procedure 430 includes providing the substrate 126 including a raw substrate surface 443 (FIG. 5A) that, once processed and smoothed, forms at least a portion of the optically-interacting region 127 of the optical component 125 (431). For example, as shown in FIG. 5A, the substrate 126 can be made of calcium fluoride $CaF_2$.

Before the raw substrate surface 443 is smoothed using accelerated neutral atom beam processing, the substrate 126 can have scratches, defects, damage, and/or contaminants at the raw substrate surface 443 that are caused by, for example, mechanical polishing or chemical etching, as discussed below with reference to FIG. 6A. The act of polishing the substrate 126 leaves a thin damaged layer (such as subsurface damage layer 626*d* in FIG. 6A) that consists of disrupted, fractured, mechanically stressed material of the substrate 126. Additionally, polishing compounds, other process contaminants, and moisture can be left behind at the raw substrate surface 443 after the polishing is performed (for example, to form a redeposition layer 626*r* as shown in FIG. 6A). Thus, without additional remediation steps (using the accelerated neutral atom beam processing discussed next), any protective layer 128 that is applied to the substrate 126 is attached to a variably disrupted and potentially contaminated substrate 126. Without smoothing the raw substrate surface 443 to thereby form the smooth substrate surface 124, the imperfect interface that is formed between the substrate 126 and the protective layer 128 can contribute to observed variability in how well the protective layer 128 works to protect the substrate 126 (and the substrate surface 124).

The raw substrate surface 443 is smoothed by impacting the raw substrate surface 443 with at least one accelerated neutral atom beam 440 (433), as shown in FIG. 5A. The accelerated neutral atom beam is scanned in both the X and Y directions to interact with and smooth the entire raw substrate surface 443 to thereby form the smooth substrate surface 124 (FIG. 5B). Each accelerated neutral atom beam 440 can be properly adjusted such that a thin layer of the raw substrate surface 443 is evenly and cleanly removed to thereby form the atomically-smooth substrate surface 124 (FIG. 5B). For example, one or more of atomic cluster density, energy, beam flux, and atom type can be adjusted for each accelerated neutral atom beam 440 that interacts with the raw substrate surface 443. In addition, a processing time in which the accelerated neutral atom beam 440 interacts with the raw substrate surface 443 (and any intermediate surface that is formed before forming the smooth substrate surface 124) can be adjusted. Moreover, in these ways, a material removal rate of the $CaF_2$ substrate 126 at the raw substrate surface 443 can be adjusted. The smoothing of the substrate surface (433) can include removing high regions 441 at the raw substrate surface 443 and leaving low regions 442 at the raw substrate surface 443.

Figure 6B:
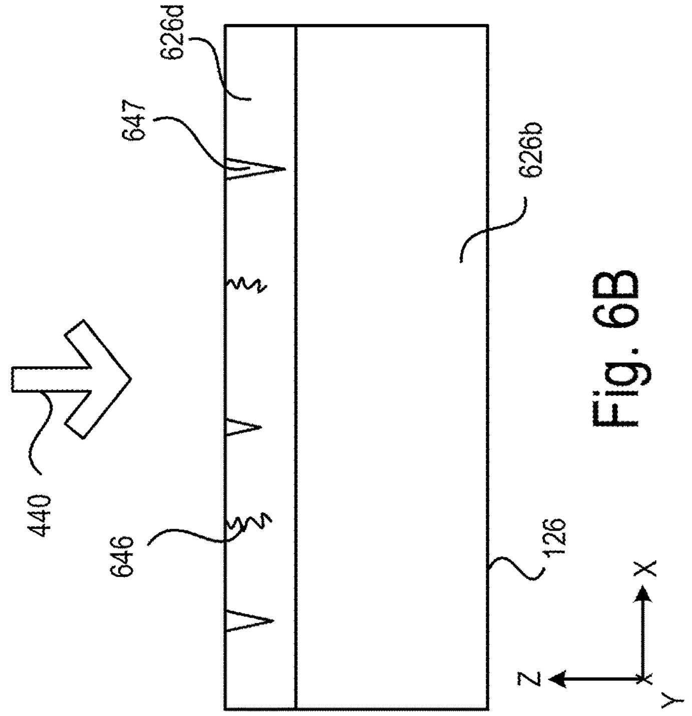
FIG. 6B is a schematic illustration of the cross-sectional view of the substrate of FIG. 6A including the damaged layer after removal of the redeposition layer using accelerated neutral atom beam processing.
Figure 6A:
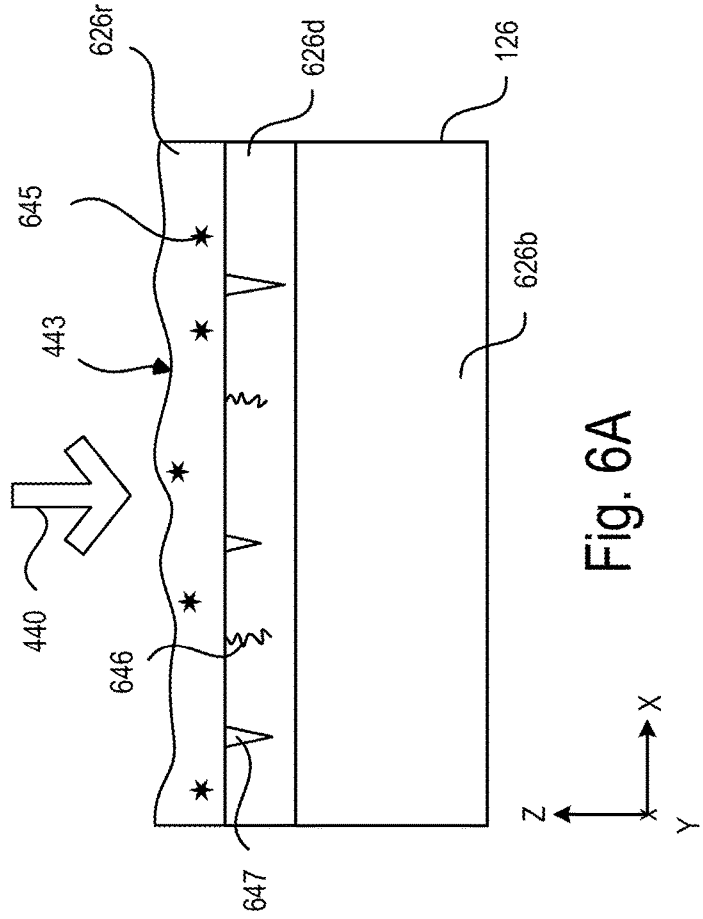
FIG. 6A is a schematic illustration of a cross-sectional view of a substrate including a damaged layer and a redeposition layer showing accelerated neutral atom beam processing within the procedure of FIG. 4.
Figure 6C:
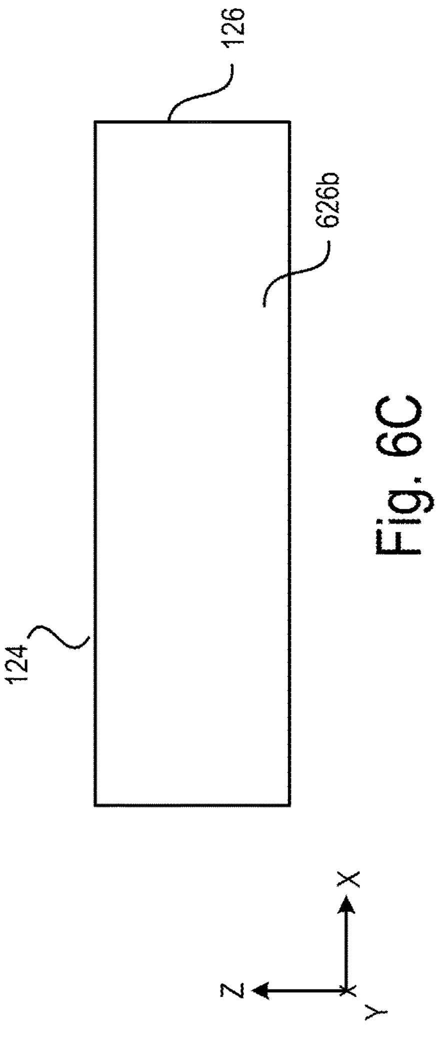
FIG. 6C is a schematic illustration of the cross-sectional view of the substrate of FIG. 6A after removal of the redeposition layer and the damaged layer using accelerated neutral atom beam processing.

Referring also to FIGS. 6A-6C, a raw substrate surface 443 of a bulk material 626*b* of the substrate 126 is shown. Smoothing the raw substrate surface 443 to form the smooth substrate surface 124 (433) can include removing a redeposition layer 626*r* (FIG. 6A) at the raw substrate surface 443 of the substrate 126. The redeposition layer 626*r* is formed during mechanical polishing of the substrate surface prior to forming the smoothed substrate surface 124 using the procedure 430. As such, the redeposition layer 626*r* includes or is formed of at least in part polishing impurities 645 (shown as solid stars) that are produced during the mechanical polishing process. Moreover, the raw substrate surface 443 can be smoothed (433) by, for example, removing subsurface damage, scratches, defects, and contaminant particles from the raw substrate surface 443. Alternatively, or in addition, smoothing the raw substrate surface 443 (433) can include removing a subsurface damaged layer 626*d* that is also at the raw substrate surface 443 of the substrate 126. The damaged layer 626*d* includes subsurface damage and defects such as micro cracks 646 (shown as squiggly lines) and plastic scratches 647 (shown as triangles). In addition, the raw substrate surface 443 can be smoothed (433) by, for example, removing damage and defects from the raw substrate surface 443 without adding additional damage or defects to the raw substrate surface 443. Thus, in some implementations, smoothing the substrate surface 443 (433) can include removing the redeposition layer 626*r* (FIGS. 6A to 6B) or the subsurface damaged layer 626*d* (FIGS. 6B to 6C), or a combination thereof, such that the substrate surface 124 is formed in the bulk material 626*b* of the substrate 126 without damage, defects, or contaminant particles at the substrate surface 124.

The impacting of the raw substrate surface 443 (433) can include adjusting a material removal rate that is dependent on an atomic cluster density within the accelerated neutral atom beam 440 and a processing time associated with how long the accelerated neutral atom beam 440 impinges on the raw substrate surface 443. In some implementations, the impacting of the raw substrate surface 443 with the at least one accelerated neutral atom beam 440 includes: impacting the raw substrate surface 443 at each step in a sequence of steps with a distinct one of the accelerated neutral atom beams 440. In other words, the substrate surface 124 can be smoothed by repeatedly removing (in a sequence) a thin layer of the raw substrate surface 443 using a distinct one of the accelerated neutral atom beams 440. The material removal rate can be adjusted at each step of impaction. For example, the removal rate of the material from the raw substrate surface 443 can be within a range of 0.3 nanometers per step to 30 nanometers per step.

By performing accelerated neutral atom beam processing on the raw substrate surface 443 to form the smooth substrate surface 124 (before applying the protective layer 128), the raw substrate surface 443 can be smoothed without adding further subsurface damage and without developing crystal lattice pits (which can be caused by etching). Moreover, in testing using a $CaF_2$ substrate 126, the smoothing (433) has been shown to not preferentially dislodge fluorine thus avoiding the formation of colloidal calcium nanoparticles. Formation of colloidal calcium nanoparticles is undesirable as it would result in development of absorption at the substrate 126 of light having a wavelength of 193 nm.

If it is determined that the substrate surface 124 is smooth (435), then the protective layer 128 is deposited onto the substrate surface 124 to from the interface 129 between the substrate 126 and the protective layer 128 (437), as shown in FIGS. 3A and 3B. The protective layer 128 mitigates or prevents damage of the surface 124. The substrate surface 124 can be determined to be smooth (or atomically-smooth) if the substrate surface 124 has a profile roughness parameter Ra (defined as a mean deviation of a profile of the atomically-smooth substrate surface 124) that is within the range of 0.01 nanometers (nm) to and including 0.17 nm. If it is determined that the substrate surface 124 is not smooth (435), then the procedure 430 continues at step 433. The procedure 430 can continue until the substrate surface 124 is determined to be smooth (or atomically-smooth). As a result, the interface 129 between the protective layer 128 and the $CaF_2$ substrate 126 lacks damage, defects, scratches, and contaminants that cause damage to the optical component 125. In this way, the lifetimes of the optical component 125 and the optical source 100 are improved.

Figure 7A:
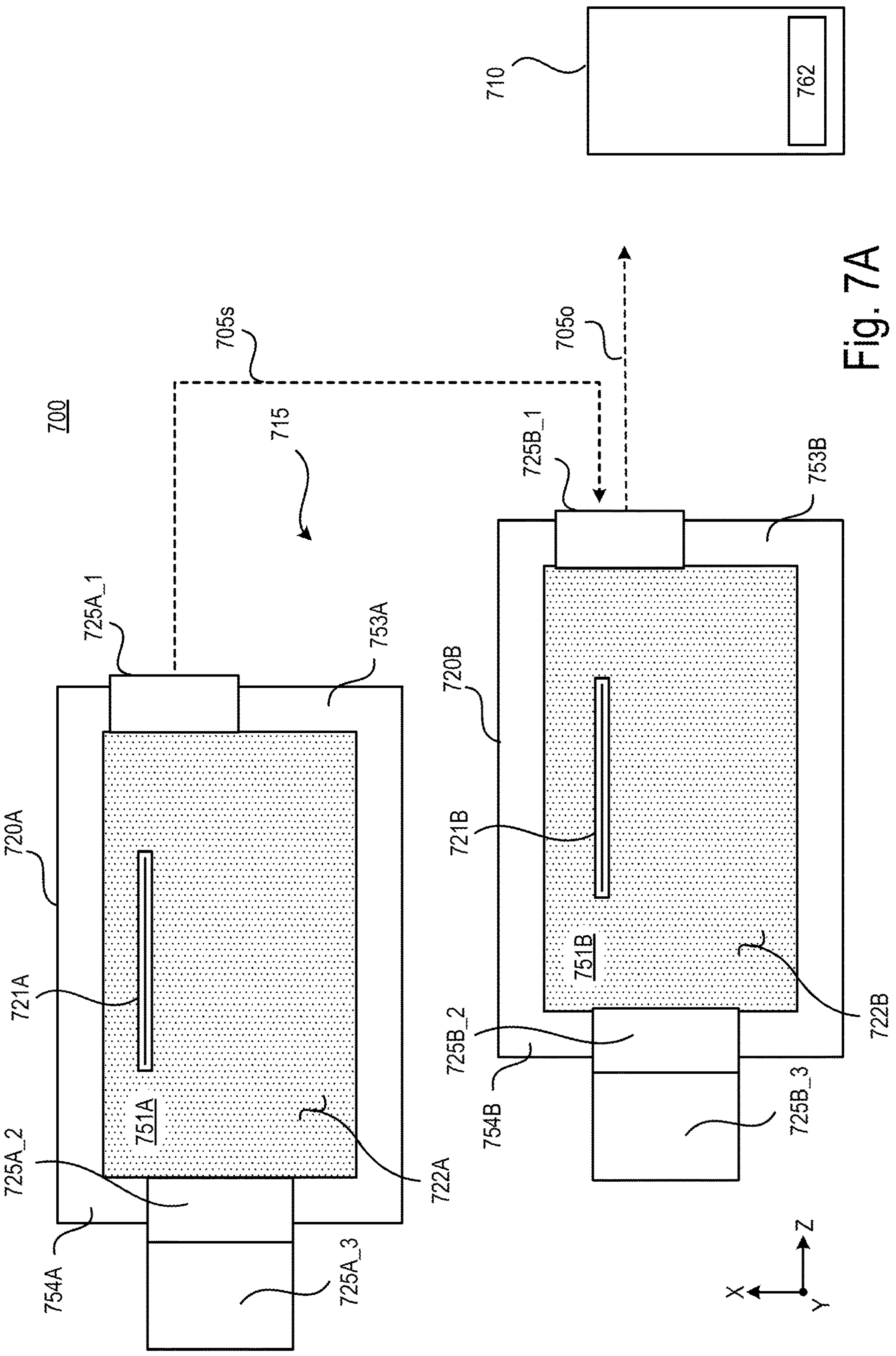
FIG. 7A is a cross-sectional view in the X-Z plane of an implementation of the optical system of FIG. 1 that includes: a gas discharge system including two gas discharge chambers, and implementations of the optical component of FIG. 1.

Referring to FIG. 7A, an implementation 700 of the optical system 100 (FIG. 1) includes a gas discharge system 715 including two gas discharge chambers 720A, 720B and implementations 725A_1, 725A_2, 725A_3, 725B_1, 725B_2, 725B_3 of the optical component 125 (FIG. 1) associated with the gas discharge system 715. The optical system 700 is configured to produce a pulsed output light beam 705*o* in the ultraviolet range for use by, for example, a lithography exposure apparatus 710 for patterning a semiconductor substrate or wafer 762. In this implementation, the discharge chamber 720A forms a master oscillator configured to produce a pulsed seed light beam 705*s*, and the discharge chamber 720B forms a power amplifier configured to produce the pulsed output light beam 705*o* from the seed light beam 705*s*. Other implementations of the optical system 700 are possible.

Each discharge chamber 720A, 720B is configured to hold a respective gas mixture 722A, 722B that includes a gain medium in a respective interior cavity 751A, 751B. The gas mixture 722A, 722B used in the respective discharge chamber 720A, 720B can be a combination of suitable gases for producing the respective light beam 705*s*, 705*o* around the required wavelengths, bandwidth, and energy. For example, the gas mixture 722A, 722B can include argon fluoride (ArF), which emits light at a wavelength of about 193 nm. Each discharge chamber 401A, 401B is defined by respective chamber walls 753A, 754A, 753B, 754B. In operation, the chamber walls 753A, 754A, 753B, 754B of each discharge chamber 720A, 720B can be sealable such that each interior cavity 751A, 751B is hermetically sealed. Each discharge chamber 720*a*, 720*b* houses a respective energy source 721A, 721B configured to supply energy to the gas mixture 722A, 722B in each interior cavity 751A, 751B. For example, each energy source 721A, 721B can include a pair of electrodes that form a potential difference and, in operation, excite the gain medium of the gas mixture 722A, 722B.

The optical components 725A_1, 725A_2, 725A_3 are associated with the master oscillator 720A and the optical components 725B_1, 725B_2, 725B_3 are associated with the power amplifier 720B. Each of the optical components 725A_1, 725A_2, 725A_3, 725B_1, 725B_2, 725B_3 is manufactured using accelerated neutral atom beam processing. As such, each of the optical components 725A_1, 725A_2, 725A_3, 725B_1, 725B_2, 725B_3 includes a substrate including an atomically-smooth substrate surface to thereby form a smooth interface between the protective layer and the substrate surface of each optical component 725A_1, 725A_2, 725A_3, 725B_1, 725B_2, 725B_3. Each of the optical components 725A_1, 725A_2, 725A_3, 725B_1, 725B_2, 725B_3 can be, for example, a window of one of the gas discharge chambers 720A, 720B, a beam reverser, a beam expansion prism, an output coupler, or a beam splitter. In the implementation of FIG. 7A, each of the optical components 725A_1, 725A_2, 725A_3, 725B_1, 725B_2, 725B_3 is configured for a light beam, such as the seed light beam 705*s* or the output light beam 705*o*, that has a wavelength in the DUV range. For example, each of the optical components 725A_1, 725A_2, 725A_3, 725B_1, 725B_2, 725B_3 is configured for a light beam, such as the seed light beam 705*s* or the output light beam 105, that has a wavelength of 193 nm.

Figure 7C:
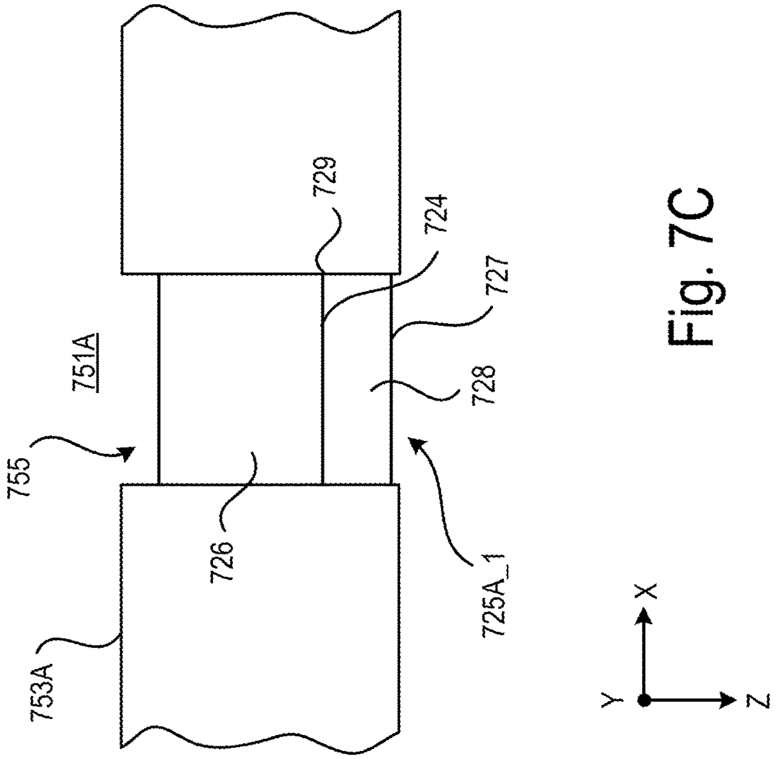
FIG. 7C is a cross-sectional view in the X-Z plane taken along the line 7C-7C' of the optical component of FIG. 7B held within the chamber wall.
Figure 7B:
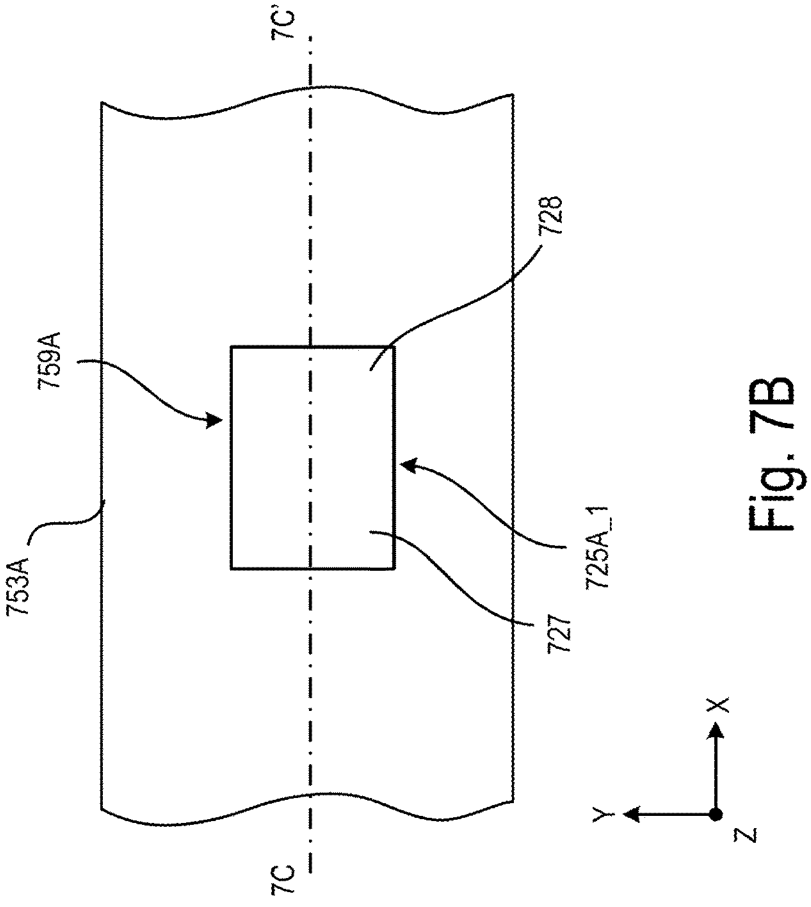
FIG. 7B is a front view in the X-Y plane of one of the optical components of FIG. 7A, the optical component held within a chamber wall of one of the gas discharge chambers of FIG. 7A.

Referring also to FIGS. 7B and 7C, the optical component 725A_1 is a window of the gas discharge chamber 720A (that forms the master oscillator). The optical component 725A_1 is arranged within an opening 755 of the chamber wall 753A of the master oscillator 720A. The window 725A_1 allows a light beam to travel in to and out of the interior cavity 751A (FIG. 7C) of the gas discharge chamber 720A. Thus, the window 725A_1 is configured to feed the pulsed seed light beam 705*s* from the gas discharge chamber 720A to the gas discharge chamber 720B.

The window 725A_1 (that is the optical component) includes a substrate 726 (FIG. 7C) including an atomically-smooth substrate surface 724 (FIG. 7C) that forms at least a portion of an optically-interacting surface 727 and a protective layer 728. The protective layer 728 is configured to mitigate or prevent damage of the atomically-smooth substrate surface 724 caused at least in part by irradiation of DUV light (such as the seed light beam 705*s*). In one example, the substrate 726 can be made of $CaF_2$, and the sealant or protective layer 728 can be configured to prevent the depletion of fluorine from the substrate 726. A smooth interface 729 is formed between the substrate 726 and the protective layer 728 by depositing the protective layer 728 onto the atomically-smooth substrate surface 724. Because the window 725A_1 includes the substrate 726 that has the atomically-smooth substrate surface 724, the smooth interface 729 lacks defects and contaminants, thereby improving the lifetime of the window 725A_1 and the optical system 700. In another example, the optical component 725A_1 can be a partially reflecting/partially transmitting optical coupler that enables the seed light beam 705*s* to exit the gas discharge chamber 720A.

Moreover, in the implementation of FIG. 7A, the optical component 725B_1 can be a window of the gas discharge chamber 720B (that forms the power amplifier) that is arranged within an opening of the chamber wall 753B of the power amplifier 720B. The optical component 725B_1 allows a light beam (such as the seed light beam 705*s* and the output light beam 705*o*) to travel in to and out of the interior cavity 751B of the gas discharge chamber 720B. In another example, the optical component 725B_1 can be a partially reflecting/partially transmitting optical coupler.

The optical components 725A_2, 725B_2 can also be windows that allow a light beam to travel in to and out of the respective interior cavity 751A, 751B of the discharge chambers 720A, 720B. In this example, the optical component 725A_2 is held within an opening of the chamber wall 754A, and the optical component 725B_2 is held within an opening of the chamber wall 754B. The optical component 725A_3 can be a component of a spectral feature module that selects a wavelength and/or a bandwidth of the seed light beam 705*s* output from the gas discharge chamber 720A. In this example, the optical component 725A_3 is arranged external to the gas discharge chamber 720A. For example, the spectral feature module 725A_3 can include one or more of beam expansion prisms or beam splitters. Moreover, the optical component 725B_3 can be a beam reverser or turner configured to direct the seed light beam 705*s* back through the gas discharge chamber 720B. In this example, the optical component 725B_3 is arranged external to the gas discharge chamber 720B.

During operational use of the optical system 700, the optical components 725A_1, 725A_2, 725A_3, 725B_1, 725B_2, 725B_3 can become damaged with irradiation of the light beams 705*s*, 705*o*. The damage to the optical components 725A_1, 725A_2, 725A_3, 725B_1, 725B_2, 725B_3 degrades performance of the gas discharge system 715 and the optical system 700, which reduces the lifetime of the gas discharge chambers 720A, 720B. In order to reduce this damage, each of the optical components 725A_1, 725A_2, 725A_3, 725B_1, 725B_2, 725B_3 is manufactured using accelerated neutral atom beam processing. As described above, each of the optical components 725A_1, 725A_2, 725A_3, 725B_1, 725B_2, 725B_3 includes a substrate including an atomically-smooth substrate surface (such as the substrate surface 724 of FIG. 7C) to thereby form a smooth interface between the protective layer and the substrate surface of each optical component 725A_1, 725A_2, 725A_3, 725B_1, 725B_2, 725B_3. Because the atomically-smooth substrate surfaces lack defects, damage, scratches, and contaminants that cause damage to the respective optical components 725A_1, 725A_2, 725A_3, 725B_1, 725B_2, 725B_3, the lifetime of the optical system 700 and the optical components 725A_1, 725A_2, 725A_3, 725B_1, 725B_2, 725B_3 is improved.

The embodiments can be further described using the following clauses:

1. An optical component comprising:

a calcium fluoride substrate comprising an atomically-smooth substrate surface that forms at least a portion of an optically-interacting surface; and a sealant layer covering the atomically-smooth substrate surface to thereby form a smooth interface between the calcium fluoride substrate and the sealant layer;

wherein a profile roughness parameter Ra of the atomically-smooth substrate surface defined as a mean deviation of a profile of the atomically-smooth substrate surface is within a range of 0.01 nanometers (nm) to and including 0.17 nm.

2. The optical component of clause 1, wherein another profile roughness parameter Rz of the atomically-smooth substrate surface defined as an average of a peak-to-valley height of a profile within a selected sampling length of the atomically-smooth substrate surface is within a range of 1.0 nm to 1.6 nm.

3. The optical component of clause 1, wherein the optical component is configured for a light beam that has a wavelength of 193 nm.

4. The optical component of clause 1, wherein the optical component is a window of a gas discharge chamber, a beam reverser, a beam expansion prism, an output coupler, or a beam splitter.

5. The optical component of clause 1, wherein the sealant layer is configured to prevent the depletion of fluorine from the calcium fluoride substrate.

6. The optical component of clause 1, wherein the optical component is configured for a light beam that has a wavelength in the deep ultraviolet range.

7. The optical component of clause 1, wherein the atomically-smooth substrate surface is actually formed using accelerated neutral atom beam processing.

8. The optical component of clause 7, wherein the formation of the atomically-smooth substrate surface does not include mechanical processing, ionized plasma processing, or chemical etching.

9. The optical component of clause 1, wherein the atomically-smooth substrate surface lacks defects, scratches, contaminant particles, and subsurface damage.

10. An optical system for deep ultraviolet (DUV) optical lithography, the optical system comprising: a gas discharge system that includes one or more gas discharge chambers, each gas discharge chamber housing an energy source and containing a gas mixture that includes a gain medium; and one or more optical components associated with the gas discharge system, wherein each optical component comprises:

a substrate comprising an atomically-smooth substrate surface that forms at least a portion of an optically-interacting surface; and a protective layer configured to mitigate or prevent damage of the atomically-smooth substrate surface caused at least in part by irradiation of DUV light, the protective layer deposited onto the atomically-smooth substrate surface to thereby form a smooth interface between the substrate and the protective layer.

11. The optical system of clause 10, wherein the gas discharge system comprises two discharge chambers including a master oscillator configured to produce a pulsed seed light beam and a power amplifier configured to produce a pulsed output light beam from the seed light beam.

12. The optical system of clause 11, wherein at least one of the optical components is configured to feed the pulsed seed light beam from the master oscillator to the power amplifier.

13. The optical system of clause 10, wherein the optical component is a window of one of the gas discharge chambers, a beam reverser, a beam expansion prism, an output coupler, or a beam splitter.

14. The optical system of clause 10, wherein a profile roughness Ra of the atomically-smooth substrate surface defined as a mean deviation of a profile of the atomically-smooth substrate surface is within a range of 0.01 nanometers (nm) to and including 0.17 nm.

15. The optical system of clause 10, wherein the atomically-smooth substrate surface is actually formed using accelerated neutral atom beam processing.

16. The optical system of clause 10, wherein the atomically-smooth substrate surface lacks defects, scratches, contaminant particles, and subsurface damage.

17. A method for mitigating or preventing damage of an optical surface of an optical component in a deep ultraviolet (DUV) light source, the method comprising:

providing a substrate comprising a substrate surface that forms at least a portion of the optical surface of the optical component;

smoothing the substrate surface by impacting the substrate surface with at least one accelerated neutral atom beam; and after smoothing the substrate surface, depositing a protective layer onto the substrate surface such that an interface is formed between the substrate and the protective layer, the protective layer configured to mitigate or prevent damage of the optical surface.

18. The method of clause 17, wherein smoothing the substrate surface comprises removing high regions at the substrate surface and leaving low regions at the substrate surface.

19. The method of clause 17, wherein smoothing the substrate surface comprises reducing a profile roughness Ra of the surface to a value below and including 0.17 nanometers (nm).

20. The method of clause 17, wherein impacting the substrate surface comprises adjusting a material removal rate that is dependent on an atomic cluster density and a processing time.

21. The method of clause 20, wherein impacting the substrate surface with the at least one accelerated neutral atom beam comprises: impacting the substrate surface at each step in a sequence of steps with a distinct one of the accelerated neutral atom beams, and wherein the material removal rate is adjusted at each step of impaction.

22. The method of clause 21, wherein the material removal rate is within a range of 0.3 nanometers per step to 30 nanometers per step.

23. The method of clause 17, wherein the substrate is made of calcium fluoride.

24. The method of clause 17, wherein smoothing the substrate surface comprises impacting the substrate surface with the at least one accelerated neutral atom beam until a profile roughness Ra of the substrate surface defined as a mean deviation of a profile of the substrate surface is within a range of 0.01 nm to and including 0.17 nm.

25. The method of clause 17, wherein the optical component is configured for a light beam that has a wavelength of 193 nm.

26. The method of clause 17, wherein the optical component is a window of a gas discharge chamber, a beam reverser, a beam expansion prism, an output coupler, or a beam splitter.

27. The method of clause 17, wherein smoothing the substrate surface comprises removing a redeposition layer at the substrate surface of the substrate, the redeposition layer formed during mechanical polishing of the substrate surface prior to smoothing the substrate surface.

28. The method of clause 17, wherein smoothing the substrate surface comprises removing subsurface damage, scratches, defects, and contaminant particles from the substrate surface.

29. The method of clause 17, wherein smoothing the substrate surface comprises removing damage and defects from the substrate surface without adding additional damage or defects to the substrate surface.

30. An optical component comprising:
- a calcium fluoride substrate comprising a smooth substrate surface that forms at least a portion of an optically-interacting surface; and
- a sealant layer deposited onto the smooth substrate surface;
- wherein the smooth substrate surface is actually formed using accelerated neutral atom beam processing.

31. The optical component of clause 30, wherein a profile roughness Ra of the smooth substrate surface defined as a mean deviation of a profile of the smooth substrate surface is within a range of 0.01 nanometers (nm) to and including 0.17 nm.

32. The optical component of clause 30, wherein the sealant layer is configured to prevent the depletion of fluorine from the calcium fluoride substrate.

33. The optical component of clause 30, wherein the optical component is configured for a light beam that has a wavelength in the deep ultraviolet range.

34. The optical component of clause 33, wherein the optical component is configured for a light beam that has a wavelength of 193 nm.

35. The optical component of clause 30, wherein the optical component is a window of a gas discharge chamber, a beam reverser, a beam expansion prism, an output coupler, or a beam splitter.

36. The optical component of clause 30, wherein the formation of the smooth substrate surface does not include mechanical processing, ionized plasma processing, or chemical etching.

37. An optical component actually formed using a process comprising:
- providing a substrate comprising a substrate surface that forms at least a portion of the optical surface of the optical component; smoothing the substrate surface by impacting the substrate surface with at least one accelerated neutral atom beam; and
- after smoothing the substrate surface, depositing a protective layer onto the substrate surface such that an interface is formed between the substrate and the protective layer, the protective layer configured to mitigate or prevent damage of the optical surface.

Other implementations are within the scope of the claims.

The invention claimed is:

1. An optical system for deep ultraviolet (DUV) optical lithography, the optical system comprising:
- a gas discharge system that includes one or more gas discharge chambers, each gas discharge chamber housing an energy source and containing a gas mixture that includes a gain medium; and
- one or more optical components associated with the gas discharge system, wherein each optical component comprises:
  - a substrate comprising an atomically-smooth substrate surface that forms at least a portion of an optically-interacting surface; and
  - a protective layer configured to mitigate or prevent damage of the atomically-smooth substrate surface caused at least in part by irradiation of DUV light, the protective layer deposited onto the atomically-smooth substrate surface to thereby form a smooth interface between the substrate and the protective layer.

2. The optical system of claim 1, wherein the gas discharge system comprises two discharge chambers including a master oscillator configured to produce a pulsed seed light beam and a power amplifier configured to produce a pulsed output light beam from the seed light beam.

3. The optical system of claim 2, wherein at least one of the optical components is configured to feed the pulsed seed light beam from the master oscillator to the power amplifier.

4. The optical system of claim 1, wherein the optical component is a window of one of the gas discharge chambers, a beam reverser, a beam expansion prism, an output coupler, or a beam splitter.

5. The optical system of claim 1, wherein a profile roughness parameter Ra of the atomically-smooth substrate surface defined as a mean deviation of a profile of the atomically-smooth substrate surface is within a range of 0.01 nanometers (nm) to and including 0.17 nm.

6. An optical system of claim 1 for deep ultraviolet (DUV) optical lithography, the optical system comprising:
- a gas discharge system that includes one or more gas discharge chambers, each gas discharge chamber housing an energy source and containing a gas mixture that includes a gain medium; and
- one or more optical components associated with the gas discharge system, wherein each optical component comprises:
  - a substrate comprising an atomically-smooth substrate surface that forms at least a portion of an optically-interacting surface; and
  - a protective layer configured to mitigate or prevent damage of the atomically-smooth substrate surface caused at least in part by irradiation of DUV light, the protective layer deposited onto the atomically-smooth substrate surface to thereby form a smooth interface between the substrate and the protective layer;
- wherein the atomically-smooth substrate surface is actually formed using accelerated neutral atom beam processing.

7. The optical system of claim 1, wherein the atomically-smooth substrate surface lacks defects, scratches, contaminant particles, and subsurface damage.

8. The optical system of claim 5, wherein another profile roughness parameter Rz of the atomically-smooth substrate surface defined as an average of a peak-to-valley height of a profile within a selected sampling length of the atomically-smooth substrate surface is within a range of 1.0 nm to 1.6 nm.

9. The optical system of claim 1, wherein each optical component is configured for a light beam that has a wavelength of 193 nm.

10. An optical system of claim 1 for deep ultraviolet (DUV) optical lithography, the optical system comprising:

a gas discharge system that includes one or more gas discharge chambers, each gas discharge chamber housing an energy source and containing a gas mixture that includes a gain medium; and one or more optical components associated with the gas discharge system, wherein each optical component comprises:

a substrate comprising an atomically-smooth substrate surface that forms at least a portion of an optically-interacting surface; and a protective layer configured to mitigate or prevent damage of the atomically-smooth substrate surface caused at least in part by irradiation of DUV light, the protective layer deposited onto the atomically-smooth substrate surface to thereby form a smooth interface between the substrate and the protective layer wherein, for each optical component, the substrate comprises a calcium fluoride substrate and the protective layer is configured to prevent the depletion of fluorine from the calcium fluoride substrate.

11. The optical system of claim 1, wherein each optical component is configured for a light beam that has a wavelength in the deep ultraviolet range.

12. The optical system of claim 1, wherein, for each optical component, the atomically-smooth substrate surface lacks defects, scratches, contaminant particles, and subsurface damage.

13. The optical system of claim 1, wherein at least one optical component is a transmissive optic.

14. The optical system of claim 1, wherein the gas mixture includes argon fluoride.

15. The optical system of claim 1, wherein the energy source includes a pair of electrodes configured to form a potential difference that excites the gain medium of the gas mixture.

16. The optical system of claim 1, wherein at least one optical component is a partially reflecting/partially transmitting optical coupler.

17. The optical system of claim 1, wherein at least one optical component is arranged external to the gas discharge chamber.

18. The optical system of claim 6, wherein a profile roughness parameter Ra of the atomically-smooth substrate surface defined as a mean deviation of a profile of the atomically-smooth substrate surface is within a range of 0.01 nanometers (nm) to and including 0.17 nm.

19. The optical system of claim 18, wherein, for each optical component, the substrate comprises a calcium fluoride substrate and the protective layer is configured to prevent the depletion of fluorine from the calcium fluoride substrate.

20. The optical system of claim 10, wherein a profile roughness parameter Ra of the atomically-smooth substrate surface defined as a mean deviation of a profile of the atomically-smooth substrate surface is within a range of 0.01 nanometers (nm) to and including 0.17 nm.

* * * * *